United States Patent [19]

Fukuda

[11] Patent Number: 4,929,916
[45] Date of Patent: May 29, 1990

[54] CIRCUIT FOR DETECTING A LOCK OF A PHASE LOCKED LOOP

[75] Inventor: Shinri Fukuda, Tokyo, Japan
[73] Assignee: NEC Corporation, Tokyo, Japan
[21] Appl. No.: 321,685
[22] Filed: Mar. 10, 1989
[30] Foreign Application Priority Data Mar. 10, 1988 [JP] Japan .................................. 63-57481

[51] Int. Cl.$^5$ .............................................. H03L 7/08
[52] U.S. Cl. .................................... 331/1 A; 331/17; 331/DIG. 2
[58] Field of Search ............. 331/1 A, 17, 25, DIG. 2

[56] References Cited

U.S. PATENT DOCUMENTS 4,122,405 10/1978 Tietz et al. .......................... 331/1 A Primary Examiner—David Mis
Attorney, Agent, or Firm—Sughrue, Mion, Zinn, Macpeak & Seas

[57] ABSTRACT

A circuit for detecting a lock of a phase locked loop comprising a phase comparator receiving a first signal and a second signal for generating a phase difference signal, a waveform shaping circuit connected to receive the phase difference signal for generating an output signal when the phase difference signal indicates a phase difference exceeding a predetermined value, and a multi-stage counter having a frequency division function and having a reset input connected to receive the output signal of the waveform shaping circuit. An input control circuit is connected to receive the first signal and an output of the multi-stage counter and has an output connected to an input of the multi-stage counter for allowing the first signal to be applied to the multi-stage counter only when the output of the multi-stage counter is at a predetermined logic level. The output of the counter provides an lock output.

4 Claims, 3 Drawing Sheets

CIRCUIT FOR DETECTING A LOCK OF A PHASE LOCKED LOOP

BACKGROUND OF THE INVENTION

1. Field of the Invention

The present invention relates to a phase locked loop, and more specifically to a circuit for detecting a lock of the phase locked loop.

2. Description of Related Art

In the prior art, one typical phase locked loop has included a phase comparator receiving an input signal and a reference signal for generating a pair of phase difference signals which assume a high logic level, respectively, when a phase coincidence is achieved. In some cases, it is necessary to detect the phase coincidence between the two input signals, namely, the phase locked condition of the phase locked loop. For this purpose, if the pair of phase difference signals are inputted to a logic gate circuit such as an AND gate (or a NAND gate), so that a high level signal (a low level signal) is generated when the phase locked loop is in a locked condition. With this arrangement, a lock condition of the phase locked loop is detected.

In the above mentioned arrangement for detecting the lock condition of the phase locked loop, however, as soon as the two input signals of the phase comparator become consistent in phase with each other, the phase lock signal is generated. This is not convenient. Namely, in the case that the phase locked loop becomes out of phase from a phase locked (or in-phase) condition and therefore operates towards an in-phase condition again, the phase of a signal to be synchronized is caused to alternately and repeatedly advance and delay with respect to the phase of a synchronizing signal, but the phase difference gradually decreases, so that, the phase of the signal to be synchronized is finally rendered consistent with the phase of the synchronizing signal. This transient characteristics will be determined by a loop gain and a damping constant of the phase locked loop, and therefore, the phase locked loop has an inherent oscillation frequency. Accordingly, in the course of the transient response of the phase locked loop, namely, in the process in which the signal to be synchronized is being brought into phase with the synchronizing signal, an erroneous lock signal is generated at each moment the two signals become instantaneously in phase.

SUMMARY OF THE INVENTION

Accordingly, it is an object of the present invention to provide a phase lock detection circuit which has overcome the above mentioned defect of the conventional one.

Another object of the present invention is to provide a phase lock detection circuit which will not generate an erroneous lock signal in the transient process of the phase locked loop toward to the phase locked condition.

A further object of the present invention is to provide a phase lock detection circuit which can generate a phase lock signal only when a phase coincidence condition continues at least for a predetermined period of time which will allow to conclude that a stable locked condition has be realized.

The above and other objects of the present invention are achieved in accordance with the present invention by a circuit for detecting a lock of a phase locked loop comprising phase comparison means receiving a first signal and a second signal for generating a phase difference signal, waveform shaping means connected to receive the phase difference signal for generating an output signal when the phase difference signal indicates a phase difference exceeding a predetermined value, a multi-stage counter having a frequency division function and having a reset input connected to receive the output signal of the waveform shaping means, input control means connected to receive the first signal and an output of the multi-stage counter and having an output connected to an input of the multi-stage counter for allowing the first signal to be applied to the multi-stage counter only when the output of the multi-stage counter is at a predetermined logic level.

The above and other objects, features and advantages of the present invention will be apparent from the following description of the preferred embodiment of the invention with reference to the accompanying drawings.

DESCRIPTION OF THE PREFERRED EMBODIMENT

Figure 1:
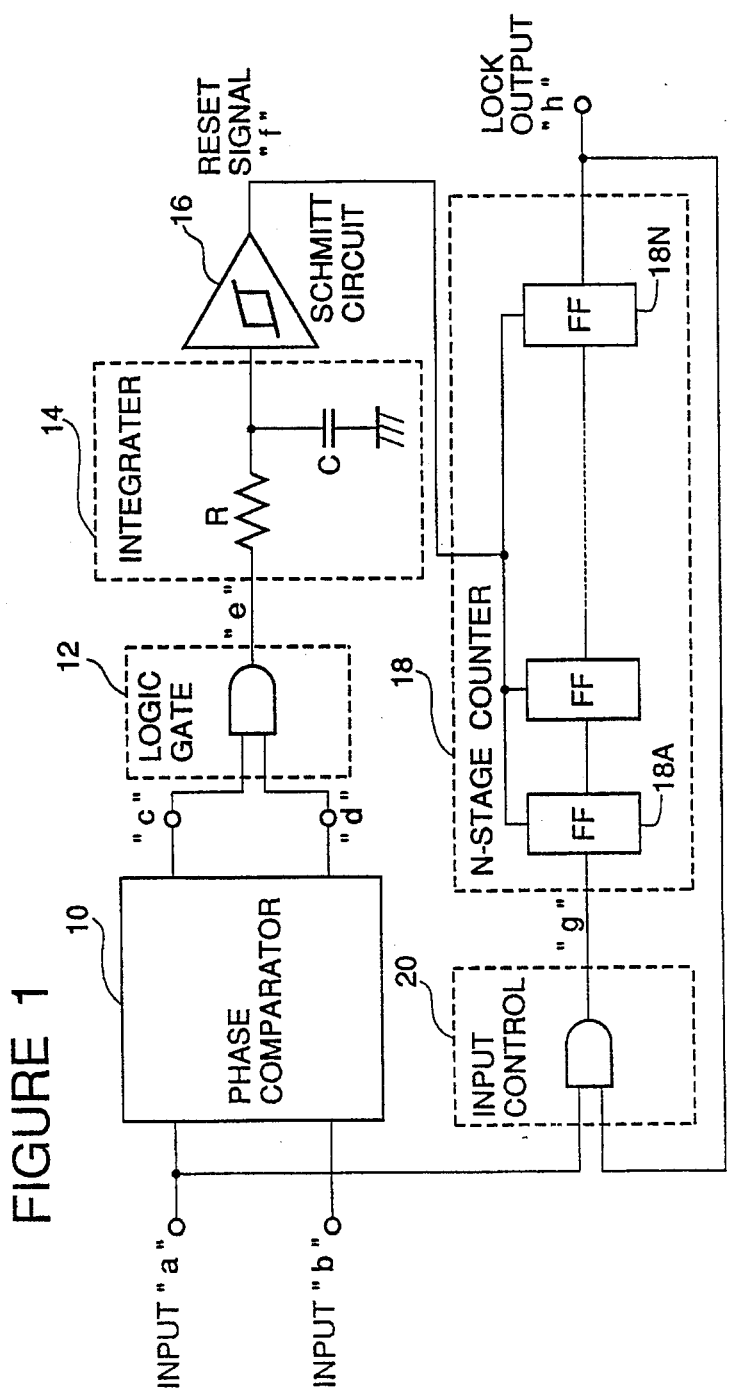
FIG. 1 is a block diagram of an embodiment of a phase lock detection circuit in accordance with the present invention.

Referring to FIG. 1, there is shown a block diagram of an embodiment of a phase lock detection circuit in accordance with the present invention. The shown phase lock detection circuit includes a phase comparator 10 receiving a reference input signal "a" and a signal "b" to be synchronized and outputting a pair of phase difference signals "c" and "d" which are supplied to a two-input logic circuit 12 such as a AND gate.

Figure 2:
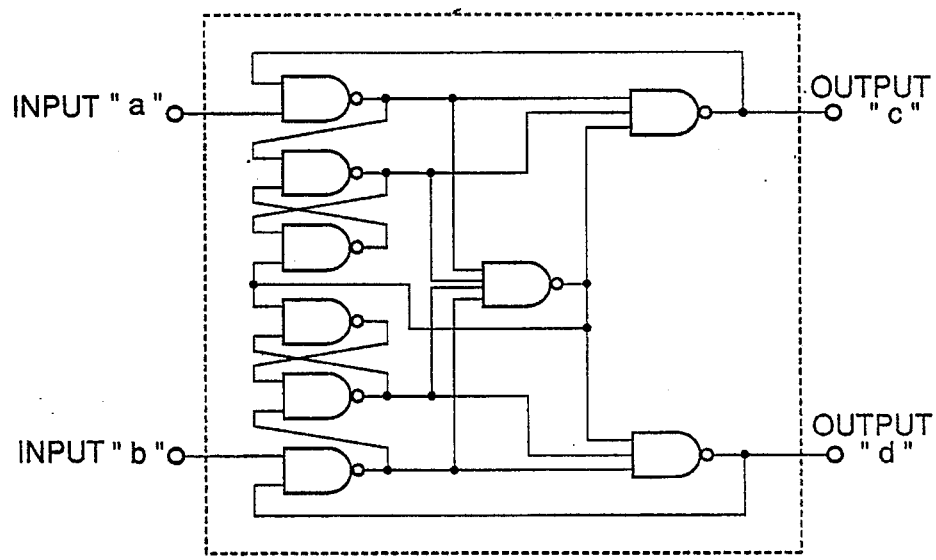
FIG. 2 is a logic circuit diagram of one example of the phase comparator used in the phase lock detection circuit shown in FIG. 1.

The phase comparator 10 can be of the sequential logic circuit type as shown in FIG. 2. The shown sequential logic circuit type of phase comparator is composed of some number of NAND gates connected as shown.

Figure 3:
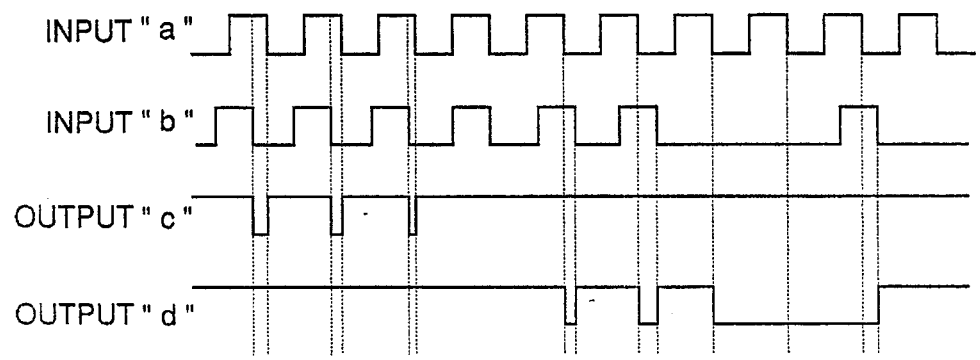
FIG. 3 is a timing chart illustrating the operation of the phase comparator shown in FIG. 2.

FIG. 3 is a timing chart illustrating the relation between the inputs "a" and "b" and the outputs "c" and "d" of the phase comparator shown in FIG. 2. Now, if the input "a" has a frequency lower than that of the input "b" or is delayed in phase from the input "b", the output "c" will assume a low level only during a period corresponding to the phase difference between the inputs "a" and "b", as seen from FIG. 3. However, the output "d" will be maintained at a high level. On the other hand, if the input "a" has a frequency higher than that of the input "b" or is advanced in phase from the input "b", the output "d" will assume a low level only during a period corresponding to the phase difference between the inputs "a" and "b", but the output "c" will be maintained at a high level, as seen from FIG. 3. Therefore, only when the inputs "a" and "b" are in phase, both the outputs "c" and "d" will assume the high level.

Incidentally, in order to realize a phase locked loop, the outputs "c" and "d" of the phase comparator shown in FIG. 2 are supplied to a low pass filter (not shown) through a charge pump (not shown), so that a digital signal is converted into an analog signal, which is applied, namely, fed back to a voltage controlled oscillator (not shown). An output of the voltage controlled oscillator is fed back to the reference input of the phase comparator, and is outputted as a synchronizing signal. With this, the phase locked loop is constituted, but, since the fundamental construction of the phase locked loop itself is well known to persons skilled in the art, a further explanation and a drawing indicating an example of the phase locked loop will be omitted.

Returning to FIG. 1, an output "e" of the logic gate 12 is inputted to an integrater 14 composed of a resister R and a capacitor C, which are connected in a well known manner to form a basic simple analog integrater. An output of the integrater 14 is connected to an input of an schmitt circuit 15, whose output "f" is connected to a reset terminal of an N-stage counter 18. The counter 18 is composed of, for example, a plurality of flipflops 18A–18N cascaded in a well known manner to form a binary counter. Here, N is not less than 2. An input of a first stage 18A of the N-stage counter 18 is connected to an output "g" of an input control circuit 20, which can be formed of an AND gate and which has a data input connected to receive the reference signal "a" and a control input connected to an output "h" of a final stage 18N of the N-stage counter 18. The output "h" of the final stage 18N of the N-stage counter 18 forms a lock output of the lock detection circuit.

Now, operation of the above mentioned phase lock detection circuit will be explained. Assume that the relation between the inputs "a" and "b" changes from a phase locked (in-phase) condition to an out-of-phase condition. As a result of the out-of-phase, the logic gate (AND gate) 12 will output a low level signal "e", which is fed through the integrater 14 and the schmitt circuit 16 to the N-stage counter 18 as a reset signal "f". When the reset signal "f" is at a low level, the N-stage counter 18 is maintained in a reset condition, so that the lock output "h" of a high level is generated. Therefore, when the reset signal "f" is brought to the low level, the N-stage counter 18 will output a high level of lock output "h" representative of an unlock condition. Accordingly, if the two inputs "a" and "b" of the phase comparator are in an out-of-phase condition, since there is maintained a condition in which the N-stage counter 18 is reset by the reset signal "f", the lock signal "h" continues to indicate the unlock condition.

If the relation between the inputs "a" and "b" changes from the out-of-phase condition to the in-phase condition, the logic gate 12 will bring its output "e" into a high level. This change of the logic gate output "e" is transmitted to the reset input "f" of the N-stage counter through the integrater 14 and the schmitt circuit 16, so that the reset condition of the counter 18 is released. On the other hand, the lock output "h" of the counter 18 is still maintained at the high level indicative of the unlocked condition. When the output "h" of the counter 18 is at a high level, the input control circuit 20 outputs the reference signal "a" as the output "g". Therefore, the N-stage counter 18 will start to count the reference signal "a" which is fed through the input control circuit 20. However, the N-stage counter 18 will continue to maintain the output signal "h" indicative of the unlocked locked condition until the counter 18 will have been supplied with the reference signal pulses of the number corresponding to $2^{N-1}$ where "N" is the stage number of the counter 18.

When the $(2^{N-1})$th pulse of the reference signal "a" is inputted to the counter 18, the output "h" of the counter 18 is brought into a low level which is representative of the fact that the phase locked loop becomes a phase locked condition. At the same time, in response to the low level output "h", the input control circuit 20 will change its output "g" to a low level. In other words, the reference signal "a" is no longer supplied to the N-stage counter 18. Therefore, the low level lock output "h" indicative of the phase locked condition is maintained until the reset signal is applied to the counter 18 again. If the inputs "a" and "b" of the phase comparator 10 become out of phase, the reset signal "f" is generated and the lock output "h" will become to indicate that the phase locked loop has changed from the phase locked condition to the unlocked condition.

In the above mentioned phase lock detection circuit, if the two inputs "a" and "b" become out of phase after the moment the two inputs "a" and "b" become in phase and before $2^{N-1}$ pulses of the reference signal "a" are generated, the counter 18 will then reset by the reset signal "f" before the counter 18 generates the low level output signal "h" indicative of the locked condition. Accordingly, the low level output signal "h" indicative of the locked condition is generated only in the case that the two inputs "a" and "b" are maintained in phase for a period in which the $2^{N-1}$ pulses of the reference signal "a" are generated.

In the locked condition of the phase locked loop, the phase comparator will continue to operate for the purpose of detecting a possible minute phase difference between the reference signal "a" and the signal "b" to be synchronized with the reference signal, so that a detected phase difference is fed back to the voltage controlled oscillator (not shown) through the loop filter (not shown) so that the locked condition is maintained. As a result, the logic gate 12 generates a very narrow or thin pulse at the timing of the reference signal "a" even in the locked condition. In order to prevent the counter 18 from being erroneously reset by the very narrow or thin pulse, the integrater 14 and the schmitt circuit 16 are provided to neglect a minute phase difference.

Here, attention should be paid to the fact that the counter is surely reset only when the two inputs "a" and "b" clearly become out of phase. Therefore, the input control circuit 20 operates to prevent the reference signal "a" from being inputted to the counter 18 when the circuit is in a stable locked condition and on the other hand to supply the reference signal "a" to the counter 18 only when the circuit is not in a stable locked condition and for a period from the moment the two inputs "a" and "b" become in phase to the moment the $2^{N-1}$ pulses of the reference signal "a" have been generated. On the other hand, when the two inputs "a" and "b" are out of phase, since the counter 18 is maintained in a reset condition, the counter will not perform a frequency division operation.

Here, if the counter 18 generates a low level of lock output "h" when the circuit is in the stable locked condition, the input control circuit 20 can be formed of not only an AND gate but also a NAND gate. In addition, as mentioned above, the logic gate 12 is formed of the AND gate but can be formed of a NAND gate.

The N-stage counter 18 may be an up-counter, and the stage number "N" of the counter 18 is determined by considering the inherent oscillation frequency depending upon the loop gain and the dumping property of the phase lock loop. If the reference signal "a" has a frequency fr, it is possible to discriminate a time expressed by $1/fr \cdot 2^{N-1}$.

Figure 4:
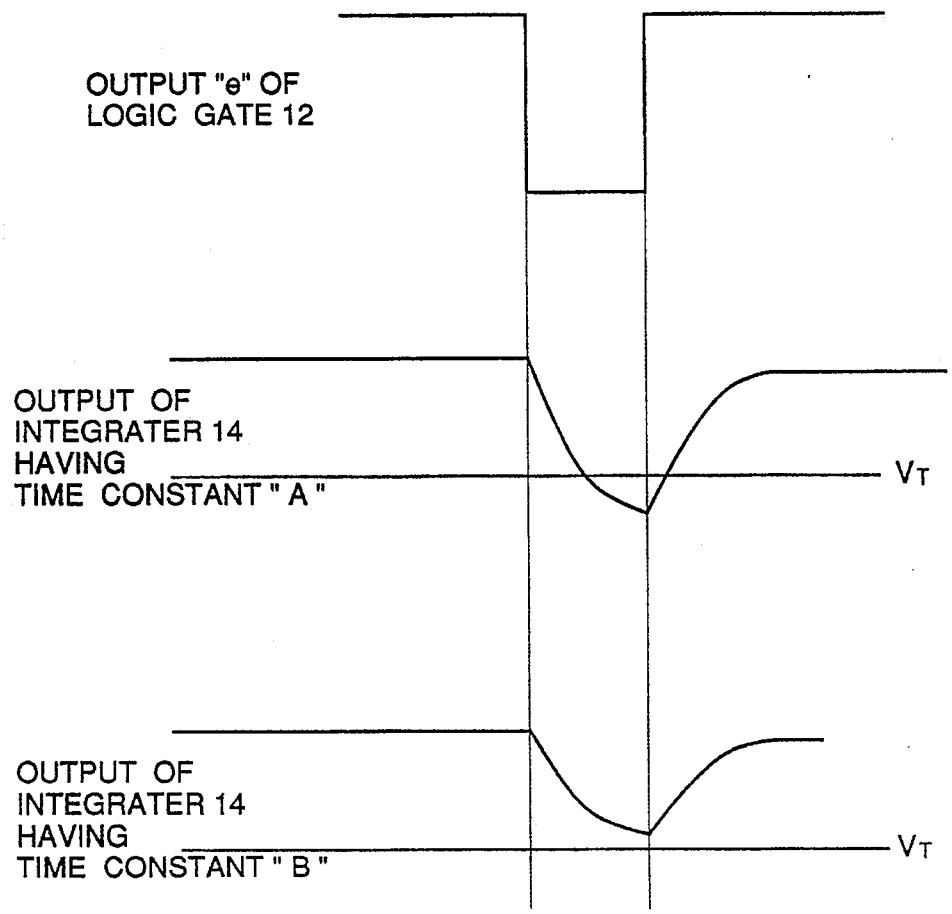
FIG. 4 is a waveform diagram illustrating an operation of an integrater which can be used in the phase lock detection circuit shown in FIG. 1.

It is possible to change an acceptable phase difference in the discrimination of the lock condition of the phase locked loop, by changing the values of the resister R and the capacitor C of the integrater 14. This will be explained with reference to FIG. 4. Assume that the inputs "a" and "b" of the phase comparator are out of phase, and therefore, the logic gate 12 generates an output signal "e" as shown in FIG. 4, and the resistor-capacitor integrater (low-pass filter) 14 has the timer constant A or B (A<B). In the case of the time constant A, in response to a low level of the output signal "e", the output of the integrater 14 will fall down less than a threshold $V_T$ of the schmitt circuit 16, and therefore, the schmitt circuit 16 will change the level of the output reset signal "f". On the other hand, in the case of the time constant B, the output of the integrater 14 will not fall down less than the threshold $V_T$ of the schmitt circuit 16, and therefore, the schmitt circuit 16 will not change the level of the output reset signal "f". Therefore, if the time constant of the resistor-capacitor integrater is made large, even if the two inputs "a" and "b" of the phase comparator become out of phase more or less, the counter 18 will never be reset, so that the circuit will not indicate the unlocked condition. Accordingly, the acceptable phase difference can be determined by the RC time constant.

As seen from the above, the phase lock detection circuit in accordance with the present invention can conclude that the phase lock has been realized, only when a stable phase locked condition is achieved. In other words, the phase locke detection circuit in accordance with the present invention will never generate an erroneous lock detection signal in the transient process of the phase locked loop towards to the stable phase locked condition.

The invention has thus been shown and described with reference to the specific embodiments. However, it should be noted that the present invention is in no way limited to the details of the illustrated structures but changes and modifications may be made within the scope of the appended claims.

I claim:

1. A circuit for detecting a lock of a phase locked loop comprising phase comparison means receiving a first signal and a second signal for generating a phase difference signal, waveform shaping means connected to receive the phase difference signal for generating an output signal when the phase difference signal indicates a phase difference exceeding a predetermined value, a multi-stage counter having a frequency division function and having a reset input connected to receive the output signal of the waveform shaping means, input control means connected to receive the first signal and an output of the multi-stage counter and having an output connected to an input of the multi-stage counter for allowing the first signal to be applied to the multi-stage counter only when the output of the multi-stage counter is at a predetermined logic level, the output of the counter providing an lock output.

2. A circuit claimed in claim 1 wherein the waveform shaping means includes an integrater having an input connected to receive the phase difference signal and a schmitt circuit connected to an output of the integrater and an output connected to the reset input of the counter.

3. A circuit claimed in claim 2 wherein the integrater is composed of an analog integrater including a resister having its one end connected to receive the phase difference signal and a capacitor connected at its one end to the other end of the resister and an input of the schmitt circuit, the other end of the capacitor being grounded.

4. A circuit claimed in claim 1 wherein the multi-stage counter is an N-stage counter (N is an integer not less than 2) having a final stage which generates a low level output signal when $2^{N-1}$ pulses are counted by the N-stage counter, and wherein the input control means includes an AND gate having a first input connected to receive the first signal and a second input connected to an output of the N-stage counter, an output and the AND gate being connected to an input of a first stage of the N-stage counter.

* * * * *